United States Patent
Shimazawa et al.

(10) Patent No.: US 6,452,385 B1
(45) Date of Patent: Sep. 17, 2002

(54) MAGNETORESISTIVE EFFECT SENSOR WITH DOUBLE-LAYERED FILM PROTECTION LAYER

(75) Inventors: Koji Shimazawa; Yoshihiro Tsuchiya; Satoru Araki, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/498,349

(22) Filed: Feb. 4, 2000

(30) Foreign Application Priority Data

Feb. 8, 1999 (JP) .......................... 11-030169

(51) Int. Cl.[7] .............................. G01R 33/09; G11B 5/39
(52) U.S. Cl. ................. 324/252; 360/324.1; 360/324.2; 427/130; 428/900
(58) Field of Search ....................... 324/252; 338/32 R; 360/324, 324.1–324.2; 427/130; 428/900

(56) References Cited

U.S. PATENT DOCUMENTS

| | | |
|---|---|---|
| 5,206,590 A | 4/1993 | Dieny et al. |
| 5,422,571 A | 6/1995 | Gurney et al. |
| 5,528,440 A | 6/1996 | Fontana et al. |
| 5,766,743 A * | 6/1998 | Fujikata et al. ......... 324/252 X |
| 5,849,422 A * | 12/1998 | Hayashi ..................... 428/611 |
| 6,074,767 A * | 6/2000 | Lin .......................... 324/252 X |
| 6,133,732 A * | 10/2000 | Hayashi ..................... 324/252 |

FOREIGN PATENT DOCUMENTS

| | | |
|---|---|---|
| JP | 7-210834 | 8/1995 |
| JP | 7-244821 | 9/1995 |

* cited by examiner

*Primary Examiner*—Gerard R. Strecker
(74) *Attorney, Agent, or Firm*—Armstrong, Westerman & Hattori, LLP

(57) ABSTRACT

A manufacturing method of a MR sensor includes forming a MR multi-layered structure of a first anti-ferromagnetic material layer, a first ferromagnetic material layer (pinned layer) which receives bias magnetic field caused by exchange coupling with the first anti-ferromagnetic material layer, a nonmagnetic material layer and a second ferromagnetic material layer (free layer) which changes its magnetization direction in response to magnetic signal applied thereto, depositing a protection layer on the MR multi-layered structure, removing full depth of at least end regions of the protection layer and a partial depth of end regions of the second ferromagnetic material layer, and forming a second anti-ferromagnetic material layer for exchange coupling to control magnetic domain in the second ferromagnetic material layer, on at least the end regions of the second ferromagnetic material layer. The removing is executed before annealing for controlling magnetization direction of the first anti-ferromagnetic material layer.

3 Claims, 4 Drawing Sheets

MAGNETORESISTIVE EFFECT SENSOR WITH DOUBLE-LAYERED FILM PROTECTION LAYER

FIELD OF THE INVENTION

The present invention relates to a magnetoresistive effect (MR) sensor utilizing a giant magnetoresistive effect (GMR) such as spin valve effect or a spin tunnel magnetoresistive effect (TMR), and to a manufacturing method of the MR sensor. Such MR sensor is used for various magneto-electronic detection devices, typically magnetic heads mounted in magnetic record and reproduction devices such as hard disk drive (HDD) units.

DESCRIPTION OF THE RELATED ART

Recently, thin-film magnetic heads with MR read sensors based on spin valve effect of GMR characteristics are proposed (U.S. Pat. Nos. 5,206,590 and 5,4212,571) in order to satisfy the requirement for ever increasing data storage densities in today's magnetic storage systems like hard disk drive units.

The spin valve effect structure includes first and second thin-film layers of a ferromagnetic material separated by a thin-film layer of nonmagnetic and electrically conductive material, and a layer of anti-ferromagnetic material is formed in physical contact with the second ferromagnetic layer to provide exchange bias magnetic field by exchange coupling at the interface of the layers. The magnetization direction in the second ferromagnetic layer is constrained or maintained by the exchange coupling, hereinafter the second layer is called "pinned layer". On the other hand the magnetization direction of the first ferromagnetic layer is free to rotate in response to an externally applied magnetic field, hereinafter the first layer is called "free layer". The direction of the magnetization in the free layer changes between parallel and anti-parallel against the direction of the magnetization in the pinned layer, and hence the magneto-resistance greatly changes and giant magneto-resistance characteristics are obtained.

The output characteristic of the spin valve MR (SVMR) sensor depends upon the angular difference of magnetization between the free and pinned layers. The direction of the magnetization of the free layer is free to rotate in accordance with an external magnetic field. That of the pinned layer is fixed to a specific direction (called as "pinned direction") by the exchange coupling between this layer and adjacently formed anti-ferromagnetic layer.

During operation of the SVMR sensor, it is required that magnetization in the free layer changes under conditions with no wall motion. This is because the magnetization change accompanied by wall motion is irreversible change and responds slower than the magnetization change accompanied by no wall motion, and therefore causes noise component called Barkhausen noise to produce. Thus, in general, bias magnetic field (longitudinal bias) from hard magnets disposed at end edges of the free layer is applied to the free layer so as to suppress the wall motion.

However, if the SVMR sensor is used under high temperature environment, change in the magnetization or pinned direction in the pinned layer and/or change in the magnetic characteristics of the free layer itself may occur due to the longitudinal bias applied to the sensor causing degradation of the sensor output to provide. Therefore, it is necessary to hold down the intensity of the longitudinal bias to the value of necessary minimum.

U.S. Pat. No. 5,528,440 discloses a method for stabilizing the magnetic domain of a free layer of a SVMR sensor by applying longitudinal bias from an additional anti-ferromagnetic material layer and an additional ferromagnetic material layer disposed at end edges of the free layer, to suppress wall motion during operation of the SVMR sensor. According to this method, since the longitudinal bias is produced by exchange coupling between the additional anti-ferromagnetic material and ferromagnetic material layers disposed at end edges, it is possible to apply the longitudinal bias to only end regions of the free layer. Thus, the value of magnetic field applied to the whole multi-layered structure of the sensor will be kept lower than that of the sensor using the hard magnet biasing structure resulting the degradation of the sensor output under high temperature environment to reduce.

Such SVMR sensor with the additional or second anti-ferromagnetic material layer for providing the longitudinal bias will be fabricated by depositing a first anti-ferromagnetic material layer, a pinned layer, a nonmagnetic metallic layer, a free layer and a protection layer on a substrate in this order, by milling the protection layer to expose end regions of the free layer and by depositing an additional ferromagnetic material layer and the second anti-ferromagnetic material layer for providing the longitudinal bias on the exposed end regions of the free layer. However, when milling the protection layer to expose the end regions of the free layer, material elements of the milled protection layer will diffuse into the free layer causing the exchange coupling for providing the longitudinal bias may be prevented at the interface between the surface of the free layer and the additional ferromagnetic material layer.

Known is a technique for cleaning the surface of MR sensor elements in order to obtain good exchange coupling for providing the longitudinal bias. For example, Japanese patent unexamined publication Nos.7(1995)-210834 and 7(1995)-244821 disclose removing of a film of oxide produced over the surfaces of MR sensor elements when anti-ferromagnetic material layers for the longitudinal bias are formed after patterning the MR sensor elements to a predetermined shape.

However, these known techniques concern cleaning of the surface of anisotropy MR sensors but not of GMR sensors such as SVMR sensors. Furthermore, these techniques cannot solve the problems due to diffusion of material elements of other layer into the free layer. Also, there is no teaching in these prior arts as to when the cleaning of the surface of the MR sensor should be executed during the manufacturing process of the MR sensor or the magnetic head.

SUMMARY OF THE INVENTION

It is therefore an object of the present invention to provide a MR sensor and a manufacturing method of the MR sensor, whereby excellent exchange coupling can be provided between a free layer and ferromagnetic material and anti-ferromagnetic material layers for producing a longitudinal bias magnetic field.

According to the present invention, a manufacturing method of a MR sensor includes forming a MR multi-layered structure of a first anti-ferromagnetic material layer, a first ferromagnetic material layer (pinned layer) which receives bias magnetic field caused by exchange coupling with the first anti-ferromagnetic material layer, a nonmagnetic material layer and a second ferromagnetic material layer (free layer) which changes its magnetization direction in response to magnetic signal applied thereto, depositing a protection layer on the MR multi-layered structure, removing full depth of at least end regions of the protection layer and a partial depth of end regions of the second ferromagnetic material layer, and forming a second anti-ferromagnetic material layer for exchange coupling to control magnetic domain in the second ferromagnetic material layer, on at least the end regions of the second ferromagnetic material layer. The removing is executed before annealing for controlling magnetization direction of the first anti-ferromagnetic material layer.

When a second anti-ferromagnetic material layer for exchange coupling to control magnetic domain in the free layer, a partial depth of end regions of the free layer is removed. By thus removing a partial depth of end regions of the free layer, diffused parts of the free layer into which component elements of the protection layer are diffused during removing the protection layer can be certainly eliminated from the free layer, and therefore excellent exchange coupling can be provided between the free layer and the second anti-ferromagnetic material layer for supplying the longitudinal bias to the free layer.

Also, since the removing of the partial depth of the free layer is executed before the annealing for controlling the magnetization direction of the first anti-ferromagnetic material layer, progress of the diffusion due to heating can be prevented. Thus, the diffusion of component elements of the protection layer into the free layer can be suppressed to the minimum extent. This means that it is not necessary to carry out the removal of the end regions of the free layer until so deep, and that the large thickness of the end regions of the free layer can be remained after the removing. As a result, easier manufacturing of the MR sensor can be expected even if the free layer becomes thinner in future.

Thus, according to the present invention, excellent exchange coupling can be certainly and easily provided between the free layer and the second anti-ferromagnetic material layer for supplying the longitudinal bias to the free layer.

It is preferred that the partial depth is determined such that the exchange coupling between the second anti-ferromagnetic material layer and the free layer is not prevented by component elements of the protection layer diffused into the free layer.

It is preferred that the protection layer is formed by a single layer film. In this case, it is more preferred that the protection layer be made of one of Cu, Al, Rh, Ru, Pt, RuRhMn, PtMn, PtMnRh and TiW.

If the protection layer is formed by such single layer film, the diffusion of the component elements of this protection layer into the free layer can be extremely reduced. Thus, it is not necessary to carry out the removal of the end regions of the free layer until so deep, and the large thickness of the end regions of the free layer can be remained after the removing. As a result, easier manufacturing of the MR sensor can be also expected even if the free layer becomes thinner in future.

It is also preferred that the protection layer is formed by a double-layered film. In this case, it is more preferred that the protection layer be made of one of Ta/PtMn, Ta/Cu, Ta/Al, Ta/Ru, TiW/Cu, TiW/Rh and TiW/Ru.

If the protection layer is formed by such double-layered film, the diffusion of the component elements of this protection layer into the free layer can be extremely reduced. Thus, it is not necessary to carry out the removal of the end regions of the free layer until so deep, and the large thickness of the end regions of the free layer can be remained after the removing. As a result, easier manufacturing of the MR sensor can be also expected even if the free layer becomes thinner in future.

Preferably, the MR multi-layered structure is a SVMR multi-layered structure, or a TMR multi-layered structure.

According to the present invention, also, a MR sensor includes a MR multi-layered structure of a first anti-ferromagnetic material layer, a first ferromagnetic material layer (pinned layer) which receives bias magnetic field caused by exchange coupling with the first anti-ferromagnetic material layer, a nonmagnetic material layer and a second ferromagnetic material layer (free layer) which changes its magnetization direction in response to magnetic signal applied thereto, a second anti-ferromagnetic material layer for exchange coupling to control magnetic domain in the second ferromagnetic material layer, formed on end regions of the second ferromagnetic material layer, and a protection layer deposited on the MR multi-layered structure. This protection layer is formed by a single layer film made of one of Cu, Al, Rh, Ru, Pt, RuRhMn, PtMn, PtMnRh and TiW, or a double-layered film made of one of Ta/PtMn, Ta/Cu, Ta/Al, Ta/Ru, TiW/Cu, TiW/Rh and TiW/Ru.

If the protection layer is formed by such single layer film or double-layered film, the diffusion of the component elements of this protection layer into the free layer can be extremely reduced. Thus, it is not necessary to carry out the removal of the end regions of the free layer until so deep, and the large thickness of the end regions of the free layer can be remained after the removing. As a result, easier manufacturing of the MR sensor can be also expected even if the free layer becomes thinner in future.

As a result, according to the present invention, excellent exchange coupling can be certainly and easily provided between the free layer and the second anti-ferromagnetic material layer for supplying the longitudinal bias to the free layer.

Preferably, the MR multi-layered structure is a SVMR multi-layered structure, or a TMR multi-layered structure.

Further objects and advantages of the present invention will be apparent from the following description of the preferred embodiments of the invention as illustrated in the accompanying drawings.

DESCRIPTION OF THE PREFERRED EMBODIMENTS

Figure 1:
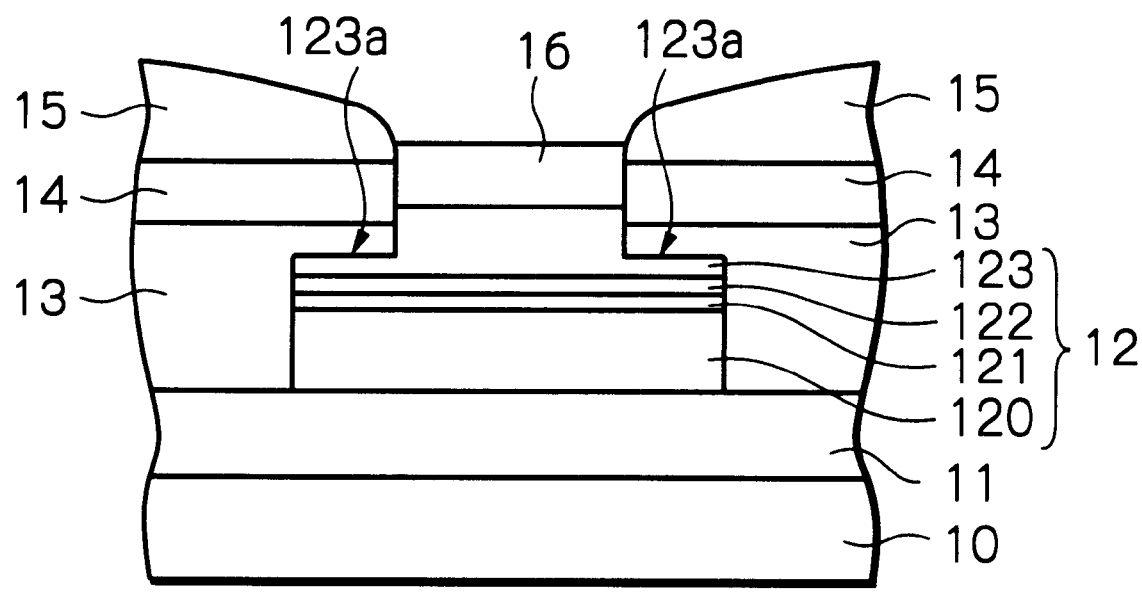
FIG. 1 shows a sectional view schematically illustrating multi-layered structure of a SVMR sensor in a thin-film magnetic head as a preferred embodiment according to the present invention.

FIG. 1 schematically illustrates multi-layered structure of a spin valve magnetoresistive effect (SVMR) sensor in a thin-film magnetic head as a preferred embodiment according to the present invention. This figure shows a sectional view seen from an air bearing surface (ABS) of the magnetic head.

In the figure, reference numeral 10 denotes a lower shield layer formed on a under layer (not shown) which covers the upper surface of a substrate (not shown), 11 a lower insulation layer deposited on the lower shield layer 10, and 12 a SVMR multi-layered structure deposited on the lower insulation layer 11, respectively.

The SVMR multi-layered structure 12 consists of a first anti-ferromagnetic material layer 120 deposited on the lower insulation layer 11, a first ferromagnetic material layer (pinned layer) 121 which is deposited on the first anti-ferromagnetic layer 120 and receives bias magnetic field by exchange coupling with layer 120, a nonmagnetic metallic material layer 122 deposited on the pinned layer 121, and a second ferromagnetic material layer (free layer) 123 which is deposited on the nonmagnetic metallic layer 122 and changes its magnetization direction in response to magnetic signals applied thereto.

In the figure, furthermore, reference numeral 13 denotes a third ferromagnetic material layer that is deposited on and closely contacted to the surfaces of the both end regions 123a in the track width direction of the free layer 123, 14 a second anti-ferromagnetic material layer deposited on the layer 13, for providing the exchange coupling bias to control magnetic domain of the free layer 123, 15 a lead conductor layer deposited on the layer 14, and 16 a protection or cap layer deposited on the SVMR multi-layered structure 12, respectively.

In this embodiment according to the present invention, Ta (thickness: 5 nm) is used as the under layer, PtMn (20 nm) as the first anti-ferromagnetic material layer 120, Co (2 nm) as the pinned layer 121, Cu (2.5 nm) as the nonmagnetic metallic material layer 122, Co (1 nm) and NiFe (8 nm) as the free layer 123, NiFe (25 nm) as the third ferromagnetic material layer 13, and RuRhMn (10 nm) as the second anti-ferromagnetic material layer 14, respectively. As for the cap layer 16, a single layer film (thickness: 5 nm) made of selected one of Cu, Al, Rh, Ru, Pt, RuRhMn, PtMn, PtMnRh and TiW, or a double-layered film (thickness: 2.5 nm/2.5 nm) made of selected one of Ta/PtMn, Ta/Cu, Ta/Al, Ta/Ru, TiW/Cu, TiW/Rh and TiW/Ru. In the description, "/" between the elements indicates that these elements are multi-layered. First element is the upper layer and the latter element is the lower layer. For example, "Ta/PtMn" represents that Ta layer and PtMn layer are multi-layered and the Ta layer is the upper layer. Therefore, in each of the aforementioned double-layered films for the cap layer, Ta or TiW layer is always located upper side (a side that will not contact with the free layer).

As for the anti-ferromagnetic material, PtMn with a composition of Pt 47–52 at % and Mn 48–53 at % (most preferably a composition of Pt 48 at % and Mn 52 at %), PtMnRh with a composition of Pt 33–52 at %, Mn 45–57 at % and Rh 0–17 at % (most preferably a composition of Pt 40 at %, Mn 51 at % and Rh 9 at %), or RuRhMn with a composition of Ru 0–20 at %, Rh 0–20 at % and Mn 75–85 at % (most preferably a composition of Ru 3 at %, Rh 15 at % and Mn 82 at %) may be used. By using a common target made of such anti-ferromagnetic material, the first and second anti-ferromagnetic material,layers 120 and 14 can be deposited. The above-mentioned compositions of the anti-ferromagnetic material are within a range of composition at which large exchange coupling will,be expected between the anti-ferromagnetic material and the ferromagnetic material in "thick-film region" as has been known from various literatures and patent publications.

Figure 2:
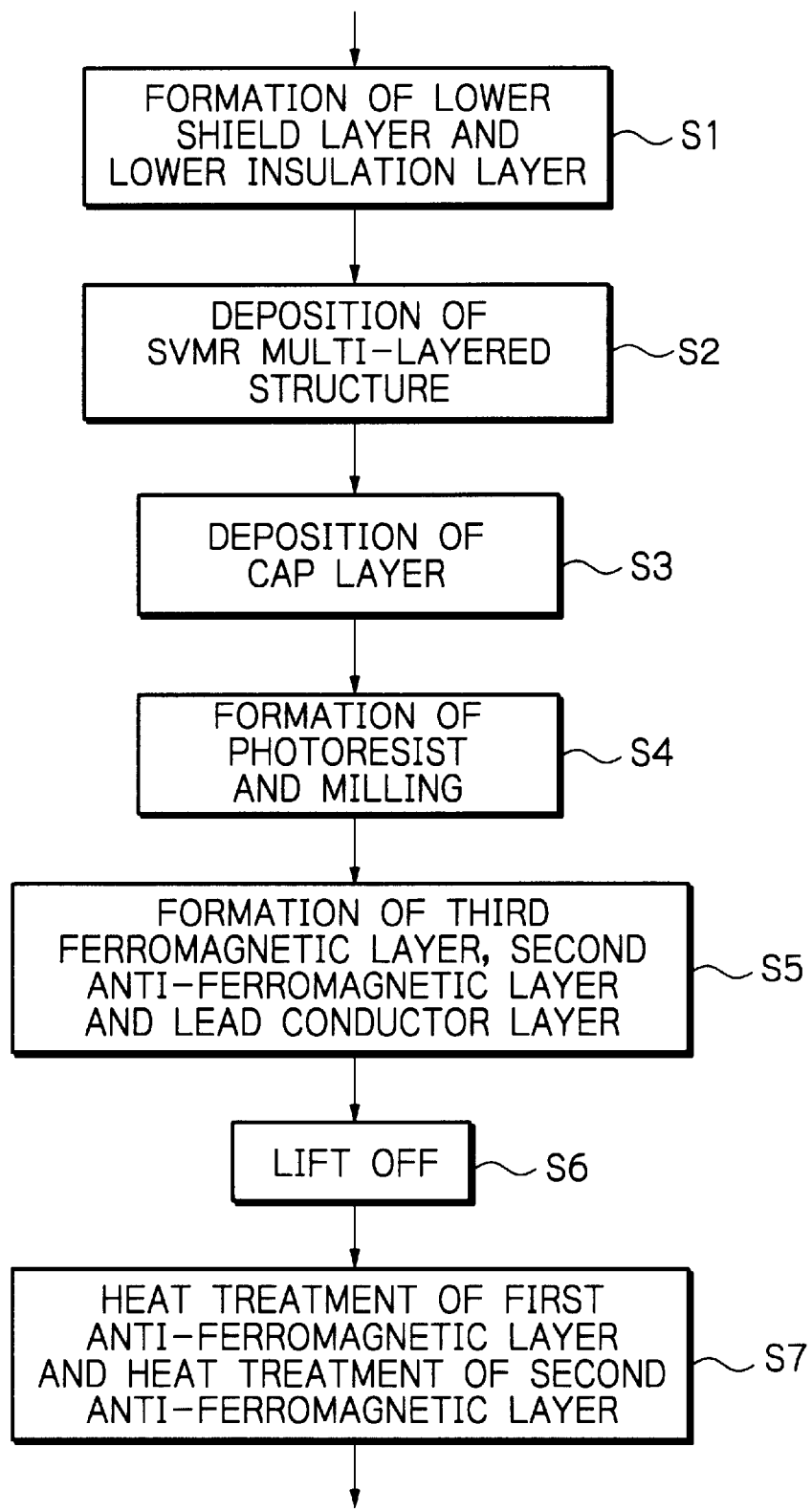
FIG. 2 shows a flow chart illustrating manufacturing processes of the SVMR sensor according to the embodiment shown in FIG. 1.

FIG. 2 illustrates manufacturing processes of the SVMR sensor according to the embodiment shown in FIG. 1, and FIGS. 3a to 3f illustrate multi-layered structure at the respective manufacturing processes.

Figure 3A:
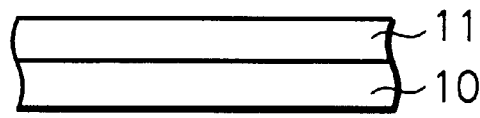
FIGS. 3a to 3f show sectional view illustrating multi-layered structure at the respective manufacturing processes according to the embodiment shown in FIG. 1.

First, as shown in step S1 of FIG. 2 and also in FIG. 3a, the lower shield layer 10 and the lower insulation layer 11 are formed on the upper surface of the substrate (not shown) via the under layer (not shown).

Figure 3B:
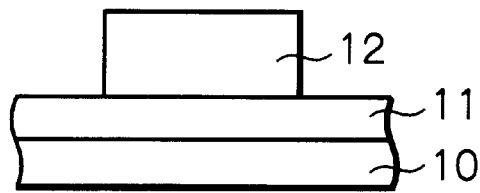

Then, as shown in step S2 of FIG. 2 and also in FIG. 3b, the SVMR multi-layered structure 12 consists of the first anti-ferromagnetic material layer 120, the pinned layer 121, the nonmagnetic metallic material layer 122 and the free layer 123 is deposited on the lower insulation layer 11.

Figure 3C:
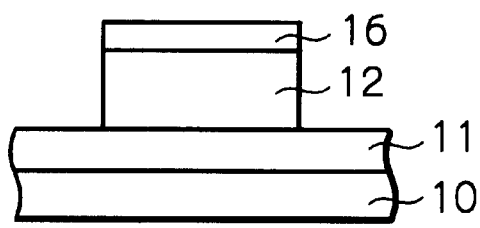
Figure 3D:
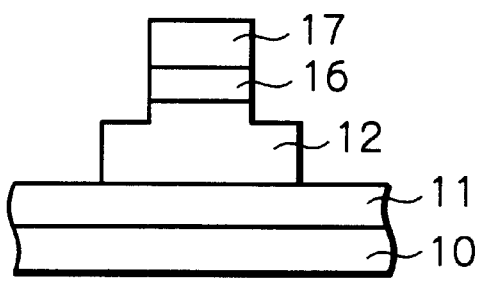

Thereafter, as shown in step S3 of FIG. 2 and also in FIG. 3c, the cap layer 16 is deposited on the SVMR multi-layered structure 12.

In the conventional manufacturing method, a heat treatment or anneal process of the first anti-ferromagnetic material layer 120 is done at this stage. However, in the manufacturing method according to the invention, no anneal process is executed at this stage but a photoresist pattern 17 having openings at portions corresponding to the end regions 123a of the free layer 123 is formed on the cap layer 16 and then dry etching such as ion milling is carried out as shown in step S4 of FIG. 2 and also in FIG. 3d. By the dry etching, full depth of the end regions of the cap layer 16 is removed and also a predetermined partial depth of the both end regions 123a of the free layer 123 is removed. This partial predetermined depth should be determined to a value so that the exchange coupling at this interface is not prevented by diffused material elements of the protection layer 16 into the free layer 123 caused by the ion milling.

Figure 3E:
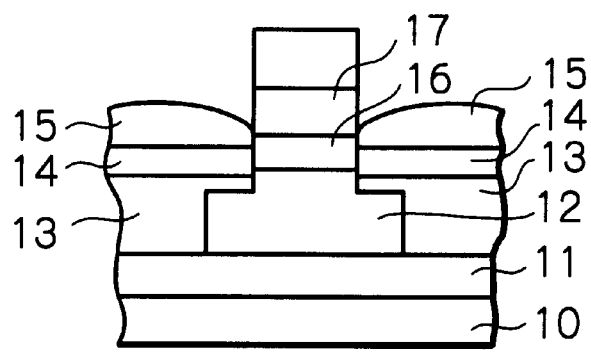

Then, as shown in step S5 of FIG. 2 and also in FIG. 3e, the third ferromagnetic material layer 13 is formed on and closely contacted to the milled and exposed surfaces of the both end regions 123a of the free layer 123, then the second anti-ferromagnetic material layer 14 is formed on the layer 13, and the lead conductor layer 15 is formed on the layer 14.

Figure 3F:
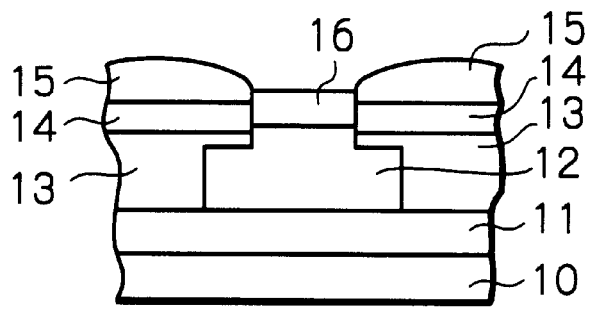

Thereafter, as shown in step S6 of FIG. 2 and also in FIG. 3f, a lift off process is carried out to remove the photoresist pattern 17 and also a part of the third ferromagnetic material layer 13, the second anti-ferromagnetic material layer 14 and the lead conductor layer 15 deposited on the photoresist pattern 17.

Then, as shown in step S7 of FIG. 2, heat treatment or anneal process of the first anti-ferromagnetic material layer 120 of the SVMR multi-layered structure 12 and heat treatment or anneal process of the second anti-ferromagnetic material layer 14 are executed.

According to this embodiment of the present invention, the end regions 123a of the free layer 123 are partially eliminated to the predetermined depth before the second anti-ferromagnetic material layer 14 for exchange coupling to provide longitudinal bias to the free layer 123 is formed on the end regions. Thus, diffused parts of the free layer 123 into which component elements of the cap layer 16 are diffused during the dry etching process of the cap layer 16 can be certainly eliminated from the free layer 123, and therefore excellent exchange coupling can be provided between the free layer 123 and the third ferromagnetic material layer 13 and the second anti-ferromagnetic material layer 14 for supplying the longitudinal bias to the free layer 123.

Also, since the removing of the partial depth of the free layer 123 is executed before the anneal process for controlling the magnetization direction of the first anti-ferromagnetic material layer 120 of the SVMR multi-layered structure 12, progress of the diffusion due to heating can be prevented. Thus, the diffusion of the material components of the cap layer 16 into the free layer 123 can be suppressed to the minimum extent. This means that it is not necessary to carry out the milling removal of the end regions 123a of the free layer 123 until so deep, and that the large thickness of the regions 123a of the free layer 123 can be remained after the milling. As a result, easier manufacturing of the SVMR sensor can be expected even if the free layer 123 becomes thinner in future.

Furthermore, if the cap layer 16 is formed by a single layer film made of selected one of Cu, Al, Rh, Ru, Pt, RuRhMn, PtMn, PtMnRh and TiW, or a double-layered film made of selected one of Ta/PtMn, Ta/Cu, Ta/Al, Ta/Ru, TiW/Cu, TiW/Rh and TiW/Ru, the diffusion of the component elements of the cap layer 16 into the free layer 123 can be extremely reduced. Thus, it is not necessary to carry out the milling removal of the end regions 123a of the free layer 123 until so deep, and the large thickness of the regions. 123a of the free layer 123 can be remained after the milling. As a result, easier manufacturing of the SVMR sensor can be also expected even if the free layer 123 becomes thinner in future.

Thus, according to this embodiment, excellent exchange coupling can be certainly and easily provided between the free layer 123 and the third ferromagnetic material layer 13 and the second anti-ferromagnetic material layer 14 for supplying the longitudinal bias to the free layer 123.

Hereinafter, described are measured results of the longitudinal bias produced by exchange coupling in a plurality of samples with different milled depth of the free layers 123 for various SVMR sensors with different cap layer materials.

Table 1 shows actually measured relationship between the value of longitudinal bias caused by exchange coupling and generated ratio of Barkhausen noise (the number of occurred Barkhausen noises/the number of measurements) of the SVMR sensor provided with the second or additional anti-ferromagnetic material layer for providing the longitudinal bias.

TABLE 1

| Exchange Coupling Bias (Oe) | Generated Ratio of Barkhausen Noise |
|---|---|
| 0 | 78/100 |
| 10 | 26/100 |
| 20 | 17/100 |
| 30 | 5/100 |
| 40 | 4/100 |
| 50 | 4/100 |

Figure 4:
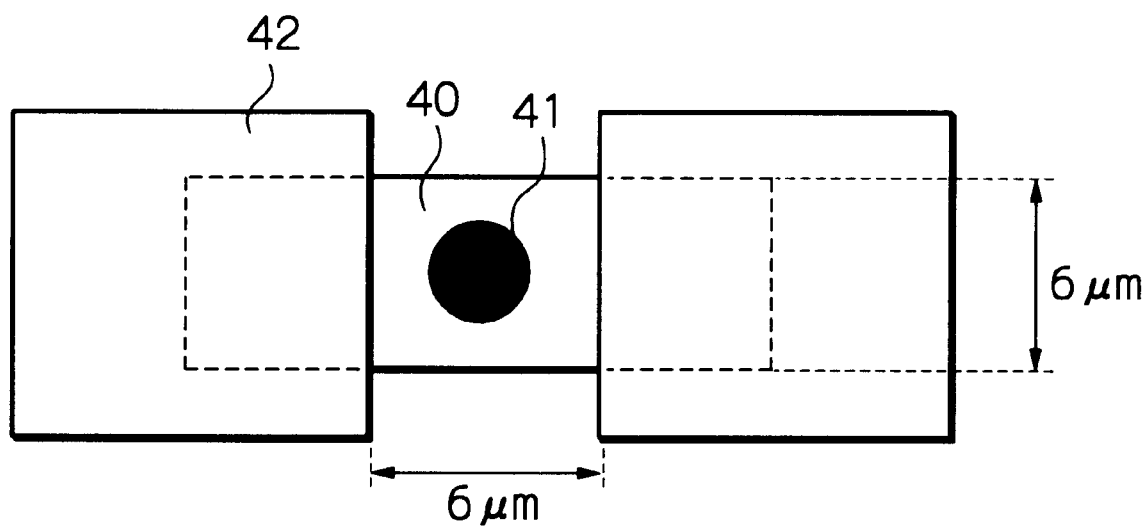
FIG. 4 illustrates a measuring method of the level of exchange coupling bias.

The values of the exchange coupling bias were obtained by radiating a laser beam 41 with a spot diameter of 3 µm on a SVMR multi-layered test piece 40 with a size of track width of 6 µm×MR height of 6 µm located on the wafer as shown in FIG. 4, and by executing the MH-LOOP measurement to evaluate the Kerr effect. The layer configuration of the SVMR test piece 40 is Ta (5 nm)/NiFe (8 nm)/Co (1 nm)/Cu (2.5 nm)/Co (2 nm)/PtMn (20 nm)/Ta (5 nm). The layer configuration of longitudinal bias generation parts 42 is NiFe (25 nm)/RuRhMn (10 nm). An actual SVMR sensor will have smaller size than that of the test piece 40, as track width of 1.0 µm×MR height of 1.2 µm for example.

As will be apparent from Table 1, the generated ratio of Barkhausen noise of samples separated from wafers that have the measured longitudinal bias caused by exchange coupling of 30 Oe or more was 5% or less. The generated ratio of Barkhausen noise did not exceed 5% even if the measured longitudinal bias increased. Thus, it is required to carry out the milling so as to make a longitudinal bias of the SVMR sensors equal to or higher than 30 Oe.

Each sample in the following examples has a SVMR multi-layered configuration of cap layer (5 nm)/NiFe (8 nm)/Co (1 mm)/Cu (2.5 nm)/Co (2 nm)/PtMn (20 nm)/Ta (5 nm) and longitudinal bias generation part multi-layered configuration of NiFe (25 nm) as the third ferromagnetic material layer 13/RuRhMn (10 nm) as the second anti-ferromagnetic material layer 14.

EXAMPLE 1

In this example 1, a single layer film of Ta (5 nm) is used as for the cap layer. Tables 2–4 indicate relationship between the milled depth (from the free layer surface) of the free layer of NiFe and the longitudinal bias at the center of the test piece. Table 2 is the measured result of the test piece to which the ion milling was executed just after deposition namely before annealing, Table 3 is the measured result of the test piece to which the ion milling was executed after annealing of 250° C.—5 hours, and Table 4 is the measured result of the test piece to which the ion milling was executed after annealing of 300° C.—5 hours. In Tables 2 and 4, composition ratio of Ta with respect to NiFe at the milled NiFe layer surface measured by the Auger spectralphotometry (Auger intensity ratio) are additionally indicated.

TABLE 2

Ion Milling was executed just after Deposition

| Milled Depth of Free Layer (nm) | Auger Intensity Ratio (%) | Longitudinal Bias (Oe) |
|---|---|---|
| 0 | 42 | 0 |
| 1 | 24 | 0 |
| 2 | 16 | 12 |
| 3 | 10 | 23 |
| 4 | 5 | 30 |
| 5 | 2 | 32 |
| 6 | 0 | 34 |
| 7 | 0 | 35 |

TABLE 3

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 0 |
| 3 | 0 |
| 4 | 7 |
| 5 | 12 |
| 6 | 34 |
| 7 | 35 |

TABLE 4

Ion Milling was executed after Annealing of 300° C. - 5 Hours

| Milled Depth of Free Layer (nm) | Auger Intensity Ratio (%) | Longitudinal Bias (Oe) |
|---|---|---|
| 0 | 77 | 0 |
| 1 | 64 | 0 |
| 2 | 58 | 0 |

TABLE 4-continued

Ion Milling was executed after Annealing of 300° C. - 5 Hours

| Milled Depth of Free Layer (nm) | Auger Intensity Ratio (%) | Longitudinal Bias (Oe) |
|---|---|---|
| 3 | 34 | 0 |
| 4 | 20 | 0 |
| 5 | 14 | 13 |
| 6 | 10 | 26 |
| 7 | 8 | 34 |

In case that the ion milling was done just after deposition namely before annealing (Table 2), the longitudinal bias would not become 30 Oe or more until the milled depth of the free layer become 4 nm or more. As aforementioned, the longitudinal bias at 30 Oe or more results in the generated ratio of Barkhausen noise at 5 % or less. Thus, in this case, it is necessary to etch the free layer until the milled depth becomes 4 nm or more in order to obtain the generated ratio of Barkhausen noise of 5% or less and the Auger intensity ratio of 10% or less.

In case that the ion milling was done after annealing of 250° C.—5 hours after deposition (Table 3), it is necessary to etch the free layer until the milled depth becomes 6 nm or more in order to obtain the generated ratio of Barkhausen noise of 5% or less.

In case that the ion milling was d one after annealing of 300° C.—5 hours after deposition (Table 4), it is necessary to etch the free layer until the milled depth becomes 7 nm or more in order to obtain the generated ratio of Barkhausen noise of 5% or less and the Auger intensity ratio of 10% or less.

As will be noted from the comparison of Auger intensity ratios between Tables 2 and 4, if the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small. However, in this example 1, since the cap layer is formed by the single layer film of Ta as well as the conventional structure, the necessary milled depth may be relatively large in comparison with that in another example even if the ion milling is done before annealing.

EXAMPLE 2

In this example 2, a single layer film of Cu (5 nm) is used as for the cap layer. Tables 5–7 indicate relationship between the milled depth (from the free layer surface) of the free layer of NiFe and the longitudinal bias at the center of the test piece. Table 5 is the measured result of the test piece to which the ion milling was executed just after deposition namely before annealing, Table 6 is the measured result of the test piece to which the ion milling was executed after annealing of 250° C.—5 hours and Table 7 is the measured result of the test piece to which the ion milling was executed after annealing of 300° C.—5 hours. In Tables 5 and 7, composition ratio of Cu with respect to NiFe at the milled NiFe layer surface measured by the Auger spectralphotometry (Auger intensity ratio) are additionally indicated.

TABLE 5

Ion Milling was executed just after Deposition

| Milled Depth of Free Layer (nm) | Auger Intensity Ratio (%) | Longitudinal Bias (Oe) |
|---|---|---|
| 0 | 28 | 3 |
| 1 | 19 | 8 |
| 2 | 13 | 23 |
| 3 | 10 | 35 |
| 4 | 7 | 34 |
| 5 | 2 | 35 |
| 6 | 0 | 36 |
| 7 | 0 | 35 |

TABLE 6

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 17 |
| 3 | 26 |
| 4 | 35 |
| 5 | 34 |
| 6 | 35 |
| 7 | 36 |

TABLE 7

Ion Milling was executed after Annealing of 300° C. - 5 Hours

| Milled Depth of Free Layer (nm) | Auger Intensity Ratio (%) | Longitudinal Bias (Oe) |
|---|---|---|
| 0 | 48 | 0 |
| 1 | 31 | 4 |
| 2 | 20 | 18 |
| 3 | 16 | 25 |
| 4 | 14 | 29 |
| 5 | 10 | 35 |
| 6 | 6 | 34 |
| 7 | 2 | 35 |

In case that the ion milling was done just after deposition namely before annealing (Table 5), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less and the Auger intensity ratio of 10% or less.

In case that the ion milling was done after annealing of 250° C.—5 hours after deposition (Table 6), it is necessary to etch the free layer until the milled depth becomes 4 nm or more in order to obtain the generated ratio of Barkhausen noise of 5% or less.

In case that the ion milling was done after annealing of 300° C.—5 hours after deposition (Table 7), it is necessary to etch the free layer until the milled depth becomes 5 nm or more in order to obtain the generated ratio of Barkhausen noise of 5% or less and the Auger intensity ratio of 10% or less.

In this example 2, since the cap layer is formed by the single layer film of Cu, the necessary milled depth of the free layer for obtaining the generated ratio of Barkhausen noise of 5% or less and the Auger. intensity ratio of 10% or less can become small in comparison with that in the example 1 wherein the single layer film of Ta is used as the cap layer.

As will be noted from the comparison of Auger intensity ratios between Tables 5 and 7, if the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 3

In this example 3, a single layer film of Al (5 nm) is used as for the cap layer. Tables 8–10 indicate relationship between the milled depth (from the free layer surface) of the free layer of NiFe and the longitudinal bias at the center of the test piece. Table 8 is the measured result of the test piece to which the ion milling was executed just after deposition namely before annealing, Table 9 is the measured result of the test piece to which the ion milling was executed after annealing of 250° C.—5 hours, and Table 10 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 8

Ion Milling was executed just after Deposition

| Milled Depth of Free Layer (nm) | Longitudinal Bias (Oe) |
|---|---|
| 0 | 3 |
| 1 | 8 |
| 2 | 22 |
| 3 | 33 |
| 4 | 34 |
| 5 | 34 |
| 6 | 36 |
| 7 | 35 |

TABLE 9

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 17 |
| 3 | 25 |
| 4 | 32 |
| 5 | 34 |
| 6 | 35 |
| 7 | 36 |

TABLE 10

Ion Milling was executed after Annealing of 300° C. - 5 Hours

| Milled Depth of Free Layer (nm) | Longitudinal Bias (Oe) |
|---|---|
| 0 | 0 |
| 1 | 4 |
| 2 | 18 |
| 3 | 24 |
| 4 | 27 |
| 5 | 32 |
| 6 | 34 |
| 7 | 35 |

In case that the ion milling was done just after deposition namely before annealing (Table 8), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 9), it is necessary to etch the free layer until the milled depth becomes 4 nm or more in order to obtain the generated ratio of Barkhausen noise of 5% or less.

In case that the ion milling was done after annealing of 300° C.—5 hours after deposition (Table 10), it is necessary to etch the free layer until the milled depth becomes 5 nm or more in order to obtain the generated ratio of Barkhausen noise of 5% or less.

In this example 3, since the cap layer is formed by the single layer film of Al, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 4

In this example 4, a single layer film of Rh (5 nm) is used as for the cap layer. Tables 11–13 indicate relationship between the milled depth (from the free layer surface) of the free layer of NiFe and the longitudinal bias at the center of the test piece. Table 11 is the measured result of the test piece to which the ion milling was executed just after deposition namely before annealing, Table 12 is the measured result of the test piece to which the ion milling was executed after annealing of 250° C.—5 hours, and Table 13 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 11

Ion Milling was executed just after Deposition

| Milled Depth of Free Layer (nm) | Longitudinal Bias (Oe) |
|---|---|
| 0 | 0 |
| 1 | 8 |
| 2 | 12 |
| 3 | 32 |
| 4 | 35 |
| 5 | 34 |
| 6 | 34 |
| 7 | 35 |

TABLE 12

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 7 |
| 3 | 13 |
| 4 | 25 |
| 5 | 32 |
| 6 | 34 |
| 7 | 35 |

TABLE 13

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 3 |
| 3 | 8 |
| 4 | 17 |
| 5 | 28 |
| 6 | 34 |
| 7 | 35 |

In case that the ion milling was done just after deposition namely before annealing (Table 11), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 12), it is necessary to etch the free layer until the milled depth becomes 5 nm or more in order to obtain the generated ratio of Barkhausen noise of 5% or less.

In case that the ion milling was done after annealing of 300° C.—5 hours after deposition (Table 13), it is necessary to etch the free layer until the milled depth becomes 6 nm or more in order to obtain the generated ratio of Barkhausen noise of 5% or less.

In this example 4, since the cap layer is formed by the single layer film of Rh, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 5

In this example 5, a single layer film of Ru (5 nm) is used as for the cap layer. Tables 14–16 indicate relationship between the milled depth (from the free layer surface) of the free layer of NiFe and the longitudinal bias at the center of the test piece. Table 14 is the measured result of the test piece to which the ion milling was executed just after deposition namely before annealing, Table 15 is the measured result of the test piece to which the ion milling was executed after annealing of 250° C.—5 hours, and Table 16 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 14

Ion Milling was executed just after Deposition

| Milled Depth of Free Layer (nm) | Longitudinal Bias (Oe) |
|---|---|
| 0 | 3 |
| 1 | 9 |
| 2 | 22 |
| 3 | 32 |
| 4 | 34 |
| 5 | 34 |
| 6 | 36 |
| 7 | 35 |

TABLE 15

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 17 |
| 3 | 25 |
| 4 | 31 |
| 5 | 32 |
| 6 | 34 |
| 7 | 35 |

TABLE 16

Ion Milling was executed after Annealing of 300° C. - 5 Hours

| Milled Depth of Free Layer (nm) | Longitudinal Bias (Oe) |
|---|---|
| 0 | 0 |
| 1 | 4 |
| 2 | 18 |
| 3 | 23 |

TABLE 16-continued

Ion Milling was executed after Annealing of 300° C. - 5 Hours

| Milled Depth of Free Layer (nm) | Longitudinal Bias (Oe) |
|---|---|
| 4 | 26 |
| 5 | 32 |
| 6 | 33 |
| 7 | 35 |

In case that the ion milling was done just after deposition namely before annealing (Table 14), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 15), it is necessary to etch the free layer until the milled depth becomes 4 nm or more in order to obtain the generated ratio of Barkhausen noise of 5% or less.

In case that the ion milling was done after annealing of 300° C.—5 hours after deposition (Table 16), it is necessary to etch the free layer until the milled depth becomes 5 nm or more in order to obtain the generated ratio of Barkhausen noise of 5% or less.

In this example 5, since the cap layer is formed by the single layer film of Ru, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 6

In this example 6, a single layer film of Pt (5 nm) is used as for the cap layer. Tables 17–19 indicate relationship between the milled depth (from the free layer surface) of the free layer of NiFe and the longitudinal bias at the center of the test piece. Table 17 is the measured result of the test piece tow which the ion milling was executed just after deposition namely before annealing, Table 18 is the measured result of the test piece to which the ion milling was executed after annealing of 250° C.—5 hours. Since Auger intensity ratios in this example exhibit the similar tendency as that in the examples 1 and 2, they are not indicated in these Tables.

TABLE 17

Ion Milling was executed just after Deposition

| Milled Depth of Free Layer (nm) | Longitudinal Bias (Oe) |
|---|---|
| 0 | 0 |
| 1 | 7 |
| 2 | 15 |
| 3 | 28 |
| 4 | 33 |
| 5 | 34 |
| 6 | 34 |
| 7 | 35 |

TABLE 18

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 0 |
| 3 | 11 |
| 4 | 23 |
| 5 | 29 |
| 6 | 34 |
| 7 | 35 |

TABLE 19

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 0 |
| 3 | 5 |
| 4 | 11 |
| 5 | 25 |
| 6 | 34 |
| 7 | 35 |

In case that the ion milling was done just after deposition namely before annealing (Table 17), the longitudinal bias would not become 30 Oe or more until the milled depth of the free layer became 4 nm or more. As aforementioned, the longitudinal bias at 30 Oe or more results in the generated ratio of Barkhausen at 5% or less. Thus, in this case, it is necessary to etch the free layer until the milled depth becomes 4 nm or more in order to obtain the generated ratio of Barkhausen noise of 5% or less.

In case that the ion milling was done after annealing of 250° C.—5 hours after deposition (Table 18), it is necessary to etch the free layer until the milled depth becomes 6 nm or more in order to obtain the generated ratio of Barkhausen noise of 5% or less.

In case that the ion milling was done after annealing of 300° C.—5 hours after deposition (Table 19), it is necessary to etch the free layer until the milled depth becomes 6 nm or more in order to obtain the generated ratio of Barkhausen noise of 5% or less.

In this example 6, since the!cap layer is formed by the single layer film of Pt, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5 t or less will become small.

EXAMPLE 7

In this example 7, a single layer film of RuRhMn (5 nm) is used as for the cap layer. Tables 20–22 indicate relationship between the milled depth (from the free layer surface) of the free layer of NiFe and the longitudinal bias at the center of the test piece. Table 20 is the measured result of the test piece to which the ion milling was executed just after deposition namely before annealing, Table 21 is the measured result of the test piece to which the ion milling was executed after annealing of 250° C.—5 hours, and Table 22 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 20

Ion Milling was executed just after Deposition

| Milled Depth of Free Layer (nm) | Longitudinal Bias (Oe) |
|---|---|
| 0 | 0 |
| 1 | 0 |
| 2 | 12 |
| 3 | 31 |
| 4 | 35 |
| 5 | 34 |
| 6 | 34 |
| 7 | 35 |

TABLE 21

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 0 |
| 3 | 13 |
| 4 | 26 |
| 5 | 32 |
| 6 | 34 |
| 7 | 35 |

TABLE 22

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 0 |
| 3 | 9 |
| 4 | 13 |
| 5 | 27 |

TABLE 22-continued

Ion Milling was executed after Annealing of 300° C. - 5 Hours

| Milled Depth of Free Layer (nm) | Longitudinal Bias (Oe) |
|---|---|
| 6 | 34 |
| 7 | 35 |

In case that the ion milling was done just after deposition namely before annealing (Table 20), the longitudinal bias would not become 30 Oe or more until the milled depth of the layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 21), it is necessary to etch the free layer until the milled depth becomes 5 nm or more in order to obtain the generated ratio of Barkhausen noise of 5% or less.

In case that the ion milling was done after annealing of 300° C.—5 hours after deposition (Table 22), it is necessary to etch the free layer until the milled depth becomes 6 nm or more in order to obtain the generated ratio of Barkhausen noise of 5% or less.

In this example 7, since the cap layer is formed by the single layer film of RuRhMn, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 8

In this example 8, a single layer film of PtMn (5 nm) is used as for the cap layer. Tables 23–25 indicate relationship between the milled depth (from the free layer surface) of the free layer of NiFe and the longitudinal bias at the center of the test piece. Table 23 is the measured result of the test piece to which the ion milling was executed just after deposition namely before annealing, Table 24 is the measured result of the test piece to which the ion milling was executed after annealing of 250° C.—5 hours, and Table 25 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 23

Ion Milling was executed just after Deposition

| Milled Depth of Free Layer (nm) | Longitudinal Bias (Oe) |
|---|---|
| 0 | 0 |
| 1 | 15 |
| 2 | 30 |
| 3 | 32 |
| 4 | 35 |
| 5 | 34 |
| 6 | 34 |
| 7 | 35 |

TABLE 24

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 17 |
| 3 | 31 |
| 4 | 33 |
| 5 | 33 |
| 6 | 34 |
| 7 | 35 |

TABLE 25

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 2 |
| 3 | 13 |
| 4 | 30 |
| 5 | 32 |
| 6 | 34 |
| 7 | 35 |

In case that the ion milling was done just after desposition namely before annealing (Table 23), the longitudinal bias would not become 30 Oe or more until the milled depth of the free layer became 2 nm or more. As aforementioned, the longitudinal bias at 30 Oe or more results in the generated ratio of Barkhausen noise at 5% or less. Thus, in this case, it is necessary to etch the free layer until the milled depth becomes 2 nm or more in order to obtain the generated ratio of Barkhausen noise of 5% or less.

In case that the ion milling was done after annealing of 250° C.—5 hours after deposition (Table 24), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 25), it is necessary to etch the free layer until the milled depth becomes 4 nm or more in order to obtain the generated ratio of Barkhausen noise of 5% or less.

In this example 8, since the cap layer is formed by the single layer film of PtMn, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 9

In this example 9, a single layer film of PtMnRh (5 nm) is used as for the cap layer. Tables 26–28 indicate relationship between the milled depth (from the free layer surface) of the free layer of NiFe and the longitudinal bias at the center of the test piece. Table 26 is the measured result of the test piece to which the ion milling was executed just after deposition namely before annealing, Table 27 is the measured result of the test piece to which the ion milling was executed after annealing of 250° C.—5 hours, and Table 28 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 26

Ion Milling was executed just after Deposition

| Milled Depth of Free Layer (nm) | Longitudinal Bias (Oe) |
|---|---|
| 0 | 0 |
| 1 | 12 |
| 2 | 26 |
| 3 | 32 |
| 4 | 35 |
| 5 | 34 |
| 6 | 34 |
| 7 | 35 |

TABLE 27

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 16 |
| 3 | 31 |
| 4 | 33 |
| 5 | 33 |
| 6 | 34 |
| 7 | 35 |

TABLE 28

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 4 |
| 3 | 13 |

TABLE 28-continued

Ion Milling was executed after Annealing of 300° C. - 5 Hours

| Milled Depth of Free Layer (nm) | Longitudinal Bias (Oe) |
|---|---|
| 4 | 30 |
| 5 | 32 |
| 6 | 34 |
| 7 | 35 |

In case that the ion milling was done just after deposition namely before annealing (Table 26), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 27), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 28), it is necessary to etch the free layer until the milled depth becomes 4 nm or more in order to obtain the generated ratio of Barkhausen noise of 5% or less.

In this example 9, since the cap layer is formed by the single layer film of PtMnRh, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 10

In this example 10, a single layer film of amorphous composition of $Ti_{10}W_{90}$ (Ti is 10 at % and W is 90 at %) (5 nm) is used as for the cap layer. Tables 29–31 indicate relationship between the milled depth (from the free layer surface) of the free layer of NiFe and the longitudinal bias at the center of the test piece. Table 29 is the measured result of the test piece to which the ion milling was, executed just after deposition namely before annealing, Table 30 is the measured result of the test piece to which:the ion milling was executed after annealing of 250° C.—5 hours, and Table 31 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 29

Ion Milling was executed just after Deposition

| Milled Depth of Free Layer (nm) | Longitudinal Bias (Oe) |
|---|---|
| 0 | 0 |
| 1 | 18 |
| 2 | 27 |
| 3 | 34 |
| 4 | 35 |
| 5 | 34 |
| 6 | 36 |
| 7 | 35 |

TABLE 30

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 15 |
| 3 | 24 |
| 4 | 33 |
| 5 | 35 |
| 6 | 34 |
| 7 | 35 |

TABLE 31

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 12 |
| 3 | 21 |
| 4 | 31 |
| 5 | 34 |
| 6 | 35 |
| 7 | 34 |

In case that the ion milling was done just after deposition namely before annealing (Table 29), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours deposition (Table 30), it is necessary to etch the free layer until the milled depth becomes 4 nm or more in order to obtain the generated ratio of Barkhausen noise of 5% or less.

In case that the ion milling was done after annealing of 300° C.—5 hours after deposition, (Table 31), it is necessary to etch the free layer until the milled depth becomes 4 nm or more in order to obtain the generated ratio of Barkhausen noise of 5% or less.

In this example 10, since the cap layer is formed by the single layer film of amorphous composition of $Ti_{10}W_{90}$, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 11

In this example 11, a double-layered film of Ta (2.5 nm)/PtMn (2.5 nm) is used as for the cap layer (The Ta layer is upper). Tables 32–34 indicate relationship between the milled depth (from the free layer surface) of the free layer of NiFe and the longitudinal bias at the center of the test piece. Table 32 is the measured result of the test piece to which the ion milling was executed just after deposition namely before annealing, Table 33 is the measured result of the test piece to which the ion milling was executed after annealing of 250° C.—5 hours, and Table 34 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 32

Ion Milling was executed just after Deposition

| Milled Depth of Free Layer (nm) | Longitudinal Bias (Oe) |
|---|---|
| 0 | 0 |
| 1 | 15 |
| 2 | 28 |
| 3 | 35 |
| 4 | 35 |
| 5 | 34 |
| 6 | 36 |
| 7 | 35 |

TABLE 33

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 16 |
| 3 | 30 |
| 4 | 33 |
| 5 | 33 |
| 6 | 34 |
| 7 | 35 |

TABLE 34

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 3 |
| 3 | 13 |
| 4 | 30 |
| 5 | 33 |
| 6 | 35 |
| 7 | 34 |

In case that the ion milling was done just after deposition namely before annealing (Table 32), the longitudinal bias would not become 30 Oe or more until the milled depth of the free layer became a depth near 3 nm or more. As aforementioned, the longitudinal bias at 30 Oe or more results in the generated ratio of Barkhausen noise at 5% or less. Thus, in this case, it is necessary to etch the free layer until the milled depth becomes about 3 nm or more in order to obtain the generated ratio of Barkhausen noise of 5% or less.

In case that the ion milling was done after annealing of 250° C.—5 hours after deposition (Table 33), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 34), it is necessary to etch the free layer until the milled depth becomes 4 nm or more in order to obtain the generated ratio of Barkhausen noise of 5% or less.

In this example 11, since the cap layer is formed by the double-layered film of Ta/PtMn, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 12

In this example 12, a double-layered film of Ta (2.5 nm)/Cu (2.5 nm) is used as for the cap layer (The Ta layer is upper). Tables 35–37 indicate relationship between the milled depth (from the free layer surface) of the free layer of NiFe and the longitudinal bias at the center of the test piece.

Table 35 is the measured result of the test piece to which the ion milling was executed just after deposition namely before annealing, Table 36 is the measured result of the test piece to which the ion milling was executed after annealing of 250° C.—5 hours, and Table 37 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 35

Ion Milling was executed just after Deposition

| Milled Depth of Free Layer (nm) | Longitudinal Bias (Oe) |
|---|---|
| 0 | 0 |
| 1 | 18 |
| 2 | 30 |
| 3 | 35 |
| 4 | 35 |
| 5 | 34 |
| 6 | 36 |
| 7 | 35 |

TABLE 36

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 23 |
| 3 | 32 |
| 4 | 33 |
| 5 | 33 |
| 6 | 34 |
| 7 | 35 |

TABLE 37

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 19 |
| 3 | 30 |
| 4 | 32 |
| 5 | 33 |
| 6 | 35 |
| 7 | 34 |

In case that the ion milling was done just after deposition namely before annealing (Table 35), the longitudinal bias would not become 30 Oe or more until the milled depth of the free layer became 2 nm or more. As aforementioned, the longitudinal bias at 30 Oe or more results in the generated ratio of Barkhausen noise at 5% or less. Thus, in this case, it is necessary to etch the free layer until the milled depth becomes 2 nm or more in order to obtain the generated ratio of Barkhausen noise of 5% or less.

In case that the ion milling was done after annealing of 250° C.—5 hours after deposition (Table 36), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 37), it is necessary to etch the free layer until the milled depth becomes 3 nm or more in order to obtain the generated ratio of Barkhausen noise of 5% or less.

In this example 12, since the cap layer is formed by the double-layered film of Ta/Cu, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen nose of 5% or less will become small.

EXAMPLE 13

In this example 13, a double-layered film of Ta (2.5 nm)/Al (2.5 nm) is used as for the cap layer (The Ta layer is upper). Tables 38–40 indicate relationship between the milled depth (from the free layer surface) of the free layer of NiFe and the longitudinal bias at the center of the test piece. Table 38 is the measured result of the test piece to which the ion milling was executed just after deposition namely before annealing, Table 39 is the measured result of the test piece to which the ion milling was executed after annealing of 250° C.—5 hours, and Table 40 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 38

Ion Milling was executed just after Deposition

| Milled Depth of Free Layer (nm) | Longitudinal Bias (Oe) |
|---|---|
| 0 | 3 |
| 1 | 8 |
| 2 | 22 |
| 3 | 32 |
| 4 | 33 |
| 5 | 34 |
| 6 | 35 |
| 7 | 35 |

TABLE 39

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 17 |
| 3 | 25 |
| 4 | 31 |
| 5 | 32 |
| 6 | 34 |
| 7 | 36 |

TABLE 40

Ion Milling was executed after Annealing of 300° C. - 5 Hours

| Milled Depth of Free Layer (nm) | Longitudinal Bias (Oe) |
|---|---|
| 0 | 0 |
| 1 | 4 |
| 2 | 18 |
| 3 | 24 |

TABLE 40-continued

Ion Milling was executed after Annealing of 300° C. - 5 Hours

| Milled Depth of Free Layer (nm) | Longitudinal Bias (Oe) |
|---|---|
| 4 | 31 |
| 5 | 32 |
| 6 | 34 |
| 7 | 35 |

In case that the ion milling was done just after deposition namely before annealing (Table 38), the longitudinal bias would not become 30 Oe or more until the milled depth of the free layer became 3 nm or more. As aforementioned, the longitudinal bias at 30 Oe or more results in the generated ratio of Barkhausen noise at 5% or less. Thus, in this case, it is necessary to etch the free layer until the milled depth becomes 3 nm or more in order to obtain the generated ratio of Barkhausen noise of 5% or less.

In case that the ion milling was done after annealing of 250° C.—5 hours after deposition (Table 39), it is necessary to etch the free layer until the milled depth becomes 4 nm or more in order to obtain the generated ratio of Barkhausen noise of 5% or less.

In case that the ion milling was done after annealing of 300° C.—5 hours after deposition (Table 40), it is necessary to etch the free layer until the milled depth becomes 4 nm or more in order to obtain the generated ratio of Barkhausen noise of 5% or less.

In this example 13, since the cap layer is formed by the double-layered film of Ta/Al, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 14

In this example 14, a double-layered film of Ta (2.5 nm)/Ru (2.5 nm) is used as for the cap layer (The Ta layer is upper). Tables 41–43 indicate relationship between the milled depth (from the free layer surface) of the free layer of NiFe and the longitudinal bias at the center of the test piece. Table 41 is the measured result of the test piece to which the ion milling was executed just after deposition namely before annealing, Table 42 is the measured result of the test piece to which the ion milling was executed after annealing of 250° C.—5 hours, and Table 43 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 41

Ion Milling was executed just after Deposition

| Milled Depth of Free Layer (nm) | Longitudinal Bias (Oe) |
|---|---|
| 0 | 0 |
| 1 | 18 |
| 2 | 30 |
| 3 | 35 |
| 4 | 35 |
| 5 | 34 |
| 6 | 36 |
| 7 | 35 |

TABLE 42

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 21 |
| 3 | 32 |
| 4 | 35 |
| 5 | 34 |
| 6 | 34 |
| 7 | 35 |

TABLE 43

Ion Milling was executed after Annealing of 300° C. - 5 Hours

| Milled Depth of Free Layer (nm) | Longitudinal Bias (Oe) |
|---|---|
| 0 | 0 |
| 1 | 0 |
| 2 | 17 |
| 3 | 28 |
| 4 | 35 |
| 5 | 34 |
| 6 | 35 |
| 7 | 34 |

In case that the ion milling was done just after deposition namely before annealing (Table 41), the longitudinal bias would not become 30 Oe or more until the milled depth of the free layer became 2 nm or more. As aforementioned, the longitudinal bias at 30 Oe or more results in the generated ratio of Barkhausen noise at 5% or less. Thus, in this case, it is necessary to etch the free layer until the milled depth becomes 2 nm or more in order to obtain the generated ratio of Barkhausen noise of 5% or less.

In case that the ion milling was done after annealing of 250° C.—5 hours after deposition (Table 42), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 43), it is necessary to etch the free layer until the milled depth becomes 4 nm or more in order to obtain the generated ratio of Barkhausen noise of 5% or less.

In this example 14, since the cap layer is formed by the double-layered film of Ta/Ru, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 15

In this example 15, a double-layered film of TiW (2.5 nm)/Cu (2.5 nm) is used as for the cap layer (The TiW layer is upper). Tables 44–46 indicate relationship between the milled depth (from the free layer surface) of the free layer of NiFe and the longitudinal bias at the center of the test piece. Table 44 is the measured result of the test piece to which the ion milling was executed just after deposition namely before annealing, Table 45 is the measured result of the test piece to which the ion milling was executed after annealing of 250° C.—5 hours, and Table 46 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 44

Ion Milling was executed just after Deposition

| Milled Depth of Free Layer (nm) | Longitudinal Bias (Oe) |
| --- | --- |
| 0 | 0 |
| 1 | 17 |
| 2 | 30 |
| 3 | 34 |
| 4 | 35 |
| 5 | 35 |
| 6 | 34 |
| 7 | 35 |

TABLE 45

Ion Milling was executed after Annealing of 250° C. - 5 Hours

| Milled Depth of Free Layer (nm) | Longitudinal Bias (Oe) |
| --- | --- |
| 0 | 0 |
| 1 | 0 |
| 2 | 24 |
| 3 | 31 |
| 4 | 33 |
| 5 | 34 |
| 6 | 34 |
| 7 | 35 |

TABLE 46

Ion Milling was executed after Annealing of 300° C. - 5 Hours

| Milled Depth of Free Layer (nm) | Longitudinal Bias (Oe) |
| --- | --- |
| 0 | 0 |
| 1 | 0 |
| 2 | 18 |
| 3 | 30 |
| 4 | 33 |
| 5 | 34 |
| 6 | 35 |
| 7 | 34 |

In case that the ion milling was done just after deposition namely before annealing (Table 44), the longitudinal bias would not become 30 Oe or more until the milled depth of the free layer became 2 nm or more. As aforementioned, the longitudinal bias at 30 Oe or more results in the generated ratio of Barkhausen noise at 5% or less. Thus, in this case, it is necessary to etch the free layer until the milled depth becomes 2 nm or more in order to obtain the generated ratio of Barkhausen noise of 5% or less.

In case that the ion milling was done after annealing of 250° C.—5 hours after deposition (Table 45), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 46), it is necessary to etch the free layer until the milled depth becomes 3 nm or more in order to obtain the generated ratio of Barkhausen noise of 5% or less.

In this example 15, since the cap layer is formed by the double-layered film of TiW/Cu, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 16

In this example 16, a double-layered film of TiW (2.5 nm)/Rh (2.5 nm) is used as for the cap layer (The TiW layer is upper). Tables 47–49 indicate relationship between the milled depth (from the free layer surface) of the free layer of NiFe and the longitudinal bias at the center of the test piece. Table 47 is the measured result of the test piece to which the ion milling was executed just after deposition namely before annealing, Table 48 is the measured result of the test piece to which the ion milling was executed after annealing of 250° C.—5 hours, and Table 49 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 47

Ion Milling was executed just after Deposition

| Milled Depth of Free Layer (nm) | Longitudinal Bias (Oe) |
|---|---|
| 0 | 0 |
| 1 | 16 |
| 2 | 27 |
| 3 | 32 |
| 4 | 35 |
| 5 | 35 |
| 6 | 34 |
| 7 | 35 |

TABLE 48

Ion Milling was executed after Annealing of 250° C. - 5 Hours

| Milled Depth of Free Layer (nm) | Longitudinal Bias (Oe) |
|---|---|
| 0 | 0 |
| 1 | 3 |
| 2 | 24 |
| 3 | 31 |
| 4 | 33 |
| 5 | 34 |
| 6 | 34 |
| 7 | 35 |

TABLE 49

Ion Milling was executed after Annealing of 300° C. - 5 Hours

| Milled Depth of Free Layer (nm) | Longitudinal Bias (Oe) |
|---|---|
| 0 | 0 |
| 1 | 2 |
| 2 | 18 |
| 3 | 30 |
| 4 | 33 |
| 5 | 34 |
| 6 | 35 |
| 7 | 34 |

In case that the ion milling was done just after deposition namely before annealing (Table 47), the longitudinal bias would not become 30 Oe or more until the milled depth of the free layer became a depth near 3 nm or more. As aforementioned, the longitudinal bias at 30 Oe or more results in the generated ratio of Barkhausen noise at 5% or less. Thus, in this case, it is necessary to etch the free layer until the milled depth becomes about 3 nm or more in order to obtain the generated ratio of Barkhausen noise of 5% or less.

In case that the ion milling was done after annealing of 250° C.—5 hours after deposition (Table 48), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 49), it is necessary to etch the free layer until the milled depth becomes 3 nm or more in order to obtain the generated ratio of Barkhausen noise of 5% or less.

In this example 16, since the cap layer is formed by the double-layered film of TiW/Rh, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

EXAMPLE 17

In this example 17, a double-layered film of TiW (2.5 nm)/Ru (2.5 nm) is used as for the cap layer (The TiW layer is upper). Tables 50–52 indicate relationship between the milled depth (from the free layer surface) of the free layer of NiFe and the longitudinal bias at the center of the test piece. Table 50 is the measured result of the test piece to which the ion milling was executed just after deposition namely before annealing, Table 51 is the measured result of the test piece to which the ion milling was executed after annealing of 250° C.—5 hours, and Table 52 is the measured result of the test piece to which the ion milling was executed after annealing of 300° C.—5 hours. Since Auger intensity ratios in this example exhibit the similar tendency as that in the examples 1 and 2, they are not indicated in these Tables.

TABLE 50

Ion Milling was executed just after Deposition

| Milled Depth of Free Layer (nm) | Longitudinal Bias (Oe) |
|---|---|
| 0 | 0 |
| 1 | 18 |
| 2 | 30 |
| 3 | 34 |
| 4 | 35 |
| 5 | 34 |
| 6 | 36 |
| 7 | 35 |

TABLE 51

Ion Milling was executed after Annealing of 250° C. - 5 Hours

| Milled Depth of Free Layer (nm) | Longitudinal Bias (Oe) |
|---|---|
| 0 | 0 |
| 1 | 0 |
| 2 | 19 |
| 3 | 31 |
| 4 | 34 |
| 5 | 35 |
| 6 | 34 |
| 7 | 35 |

TABLE 52

Ion Milling was executed after Annealing of 300° C. - 5 Hours

| Milled Depth of Free Layer (nm) | Longitudinal Bias (Oe) |
|---|---|
| 0 | 0 |
| 1 | 0 |

TABLE 52-continued

Ion Milling was executed after Annealing of 300° C. - 5 Hours

| Milled Depth of Free Layer (nm) | Longitudinal Bias (Oe) |
|---|---|
| 2 | 16 |
| 3 | 27 |
| 4 | 34 |
| 5 | 34 |
| 6 | 35 |
| 7 | 34 |

In case that the ion milling was done just after deposition namely before annealing (Table 50), the longitudinal bias would not become 30 Oe or more until the milled depth of the free layer became 2 nm or more. As aforementioned, the longitudinal bias at 30 Oe or more results in the generated ratio of Barkhausen noise at 5% or less. Thus, in this case, it is necessary to etch the free layer until the milled depth becomes 2 nm or more in order to obtain the generated ratio of Barkhausen noise of 5% or less.

In case that the ion milling was done after annealing of 250° C.—5 hours after deposition (Table 51), it is necessary to etch the free layer until the milled depth becomes 3 nm or more in order to obtain the generated ratio of Barkhausen noise of 5% or less.

In case that the ion milling was done after annealing of 300° C.—5 hours after deposition (Table 52), it is necessary to etch the free layer until the milled depth becomes 4 nm or more in order to obtain the generated ratio of Barkhausen noise of 5% or less.

In this example 17, since the cap layer is formed by the double-layered film of TiW/Ru, the necessary milled depth of the free layer for obtaining the generated ratio of Barkhausen noise of 5% or less can become small in comparison with that in the example 1 wherein the single layer film of Ta is used as the cap layer.

If the ion milling of the free layer is done after the annealing, diffusion will progress and therefore it is necessary to increase the milled depth of the free layer in order to get sufficient longitudinal bias so as to obtain the generated ratio of Barkhausen noise of 5% or less. Whereas, if the ion milling is done before annealing, the necessary milled depth for obtaining the generated ratio of Barkhausen noise of 5% or less will become small.

Although the above-mentioned embodiment and examples relate to SVMR sensors and manufacturing method thereof, the present invention can be applied to a TMR sensor which has the similar multi-layered structure but uses a very thin nonmagnetic insulation material layer instead of the nonmagnetic metallic material layer.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetoresistive effect sensor comprising:

a magnetoresistive effect multi-layered structure of a first anti-ferromagnetic material layer positioned underneath a first ferromagnetic material layer which receives a bias magnetic field caused by an exchange coupling with said first anti-ferromagnetic material layer, a nonmagnetic material layer on top of said first ferromagnetic material layer and underneath a second ferromagnetic material layer which changes its magnetization direction in response to a magnetic signal applied thereto;

a second anti-ferromagnetic material layer for an exchange coupling to control a magnetic domain in said second ferromagnetic material layer, formed on end regions of said second ferromagnetic material layer; and a protection layer deposited on said magnetoresistive effect multi-layered structure;

said protection layer being formed by a double-layered film made of one of Ta/PtMn, Ta/Cu, Ta/Al, Ta/Ru, TiW/Cu, TiW/Rh and TiW/Ru.

2. The sensor as claimed in claim 1, wherein said magnetoresistive effect multi-layered structure is a spin valve magnetoresistive effect multi-layered structure.

3. The sensor as claimed in claim 1, wherein said magnetoresistive effect multi-layered structure is a spin tunnel magnetoresistive effect multi-layered structure.

* * * * *